United States Patent
Orozov et al.

(10) Patent No.: US 6,239,655 B1
(45) Date of Patent: May 29, 2001

(54) MICROPHONE AMPLIFIER WITH DIGITAL GAIN CONTROL

(75) Inventors: Borislav Lubenov Orozov; Dennis Lloyd Caldwell; Larry Eugene Hand; Thomas Richard Stuckman, all of Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 0 days.

(21) Appl. No.: 09/365,019

(22) Filed: Aug. 2, 1999

Related U.S. Application Data

(60) Provisional application No. 60/128,305, filed on Apr. 8, 1999.

(51) Int. Cl.$^7$ .............................. H03F 1/36; H03F 21/00
(52) U.S. Cl. ........................... 330/86; 330/282; 381/121
(58) Field of Search ................ 330/69, 86, 282, 330/284; 381/120; 11/121

(56) References Cited

U.S. PATENT DOCUMENTS

| | | | |
|---|---|---|---|
| H965 | 9/1991 | Davis et al. | 330/254 |
| 4,292,596 | 9/1981 | Ishizuka et al. | 330/254 |
| 4,462,003 | 7/1984 | Takamatsu | 330/254 |
| 4,731,851 | 3/1988 | Christopher | 330/284 |
| 4,918,397 | * 4/1990 | Kidger | 330/86 |
| 5,201,009 | * 4/1993 | Yamada et al. | 330/284 |
| 5,216,355 | 6/1993 | Terada et al. | 323/354 |
| 5,266,905 | 11/1993 | Johnson | 330/85 |
| 5,285,169 | 2/1994 | Theus | 330/254 |
| 5,313,712 | 5/1994 | Curameng et al. | 33/354 |
| 5,387,879 | * 2/1995 | Satoh | 330/86 |
| 5,406,636 | 4/1995 | Yamada et al. | 381/106 |
| 5,408,199 | * 4/1995 | Nagano et al. | 330/284 |
| 5,486,791 | * 1/1996 | Spitalny et al. | 330/282 |
| 5,523,712 | 6/1996 | Miyabe et al. | 330/254 |
| 5,668,501 | 9/1997 | Venes | 330/254 |
| 5,668,502 | 9/1997 | Rijns | 330/254 |
| 5,684,431 | 11/1997 | Gilbert et al. | 330/254 |
| 5,777,513 | 7/1998 | Guyot | 330/252 |
| 5,877,612 | 3/1999 | Straw | 330/254 |
| 5,946,608 | * 8/1999 | Morita et al. | 330/282 |
| 6,127,893 | * 10/2000 | Llewellyn et al. | 330/284 |

\* cited by examiner

*Primary Examiner*—Benny Lee
*Assistant Examiner*—Khanh Van Nguyen
(74) *Attorney, Agent, or Firm*—Dykema Gossett PLLC

(57) ABSTRACT

A remotely controlled microphone amplifier has a first amplifier stage with a variable gain circuit operatively connected in the overall feedback loop of the first stage for controlling the gain in first increments. A unity gain second amplifier stage has variable attenuator operatively coupled between the output of the first amplifier stage and the input of the second amplifier stage. The variable attenuator controls the input to the second stage in second increments less than the first increments. The overall gain is linearly adjustable and varies in equal increments.

14 Claims, 3 Drawing Sheets

MICROPHONE AMPLIFIER WITH DIGITAL GAIN CONTROL

CROSS-REFERENCE TO RELATED APPLICATION

This application is related to and claims the benefit of U.S. Provisional Application Ser. No. 60/128,305 filed Apr. 8, 1999, the teachings of which are incorporated herein by reference.

BACKGROUND OF THE INVENTION

The invention pertains to a microphone amplifier having a digital control and more particularly to a two stage amplifier in which the first stage employs a feedback circuit providing relatively large gain control increments and a second stage employs an attenuator providing relatively small gain control increments so that the resulting overall gain control is substantially linear with equal increments.

Variable-gain microphone preamplifiers are employed in various applications including mixing consoles for sound reinforcement or recording, architectural electro-acoustic systems, public address (PA) systems and the like.

In large systems, the audio equipment is installed in a different area or location remote, from the control room. This makes remote control of the microphone amplifier gain highly desirable and necessary. However, satisfactory remote control is difficult to achieve.

It is desirable to digitally control the gain of a microphone amplifier (MA) in equal logarithmic increments, assuring at the same time good resolution and continuity. This is likewise difficult to achieve economically.

Typically the processing or analog to digital (A/D) conversion, if any, of an audio signal occurs at signal levels of about 1V or higher. A typical dynamic microphone has an output of about 1 mV. An amplifier gain of about 60 dB (×1000) is necessary to elevate the low microphone output signal to a level that can be either converted into digital form or further processed in the analog domain.

On the other hand, different microphone designs and wide dynamic range of the audio-source signal can cause the microphone output level to vary drastically, requiring the microphone amplifier gain to be made variable within the same wide range.

In a typical application, the control element is a potentiometer with a special taper located on the front panel of the piece of audio equipment. This makes remote gain control difficult if not impossible, leaving manual control as the only practical control option.

A microphone amplifier (MA) is typically designed as a linear (no distortion), high-gain (60 dB), variable gain (0~60 dB), high headroom (20 dB) amplifier with a relatively low equivalent input noise (EIN) level of less than −125 dBu at maximum gain. A well designed MA should also meet the following requirements:

1. Balanced input for high Common Mode Rejection Ratio (CMRR).
2. Operative with low input levels 0.5~1 mV. (−60 dBu) and high output (about 0 dBu) suitable for further processing or A/D conversion.
3. Low noise: SNR~70 dBu @ maximum gain of 60 dB and EIN<−125 dBu.
4. Wide gain range (0~60 dB) in virtually all cases accomplished by a potentiometer. To achieve continuity and uniform gain change in dB over the entire control range the potentiometer has a special, close to, but steeper than reverse-logarithmic (rev-audio) taper. The gain change should not affect the CMRR.
5. Sufficient headroom of 20+dB above the nominal level of usually 0 dBu.

In addition, an MA desirably includes the option of:

6. Balanced output for better interface with a consequent piece of equipment or A/D) converters.

A microphone amplifier with digital gain control should have the same electrical and noise characteristics as a conventional high quality microphone amplifier plus the added flexibility of digitally controlled gain in:

7. Equal (uniform) logarithmic increments (dB). The incremental control comes from the nature of any digitally controlling or processing system, where all parameter changes can be implemented only in discrete steps.

Finally, an MA should:

8. provide smooth, uniform gain control in a sufficient number of steps without an unreasonable increase in hardware. This is directly related to the practicality of the design.

One conventional approach uses a digital volume control integrated circuit. These are so called digital potentiometers basically consisting of a resistive ladder and analog switches providing attenuation, or sometimes a gain, that works like a mechanical potentiometer with large number of tabs or steps. An associated digital circuit controls the transfer (attenuation) ratio and provides the interface with a CPU.

Some exemplary digital potentiometers are passive attenuators. Some are combined with operational amplifiers. Most can be connected in different feedback circuits to replace variable resistors and to perform a variety of gain control functions. Some provide linear or logarithmic change of the transfer ratio in 8 to 256 increments of 0.5 to 1 dB in wide range (80~126 dB). Used by themselves, however, digital potentiometers all are unsuitable for a microphone amplifiers, because they do not meet requirements 1, 3, 5 and 6.

In another approach, an analog microphone amplifier is used. This approach may meet some of the desired requirements, but does not meet requirements 4, 7, and 8.

A significant problem is that even if a suitable analog circuit for a microphone amplifier is selected in order to meet the balance, noise, and headroom requirements, implementing a uniform gain change of 60 dB in equal, logarithmic increments of 0.5 to 1 dB would require between 60 and 120 separate steps. Although having such large number of steps, existing digital potentiometers can not provide a uniform incremental gain change, because none meet the requirement 4.

The trade-off appears to be between good microphone amplifier performance with non-uniform gain change in equal increments in dB, or using an analog circuit combined with an integral digital potentiometer, providing uniform incremental gain change in dB, but mediocre or poor microphone amplifier performance.

Yet another approach uses an appropriate MA with a discrete resistive ladder and switches in the feedback loop. The way to achieve a uniform step in dB is to utilize an appropriate MA and to optimize the resistor values in the feedback resistive ladder. This can only be accomplished with a discrete design, which may solve the noise problem by using an appropriate MA. However such an implementation would require a prohibitively high number of switches and precise resistors, one each per step: 60~120. As a result, the discrete design is not practical and does not meet requirement 8.

Nevertheless, it is desirable to use discrete switches because the discrete approach offers a complete solution. Therefore an alternative solution using discrete switches is desirable if it can be made in a practical manner.

SUMMARY OF THE INVENTION

The invention reduces the number of switches and discrete components to a reasonable, i.e. practical number by adding a second amplifier to a high quality, analog microphone amplifier and splitting the gain control finction between the two stages. The circuit allows the gain of the first stage to change in relatively large (10 dB) increments and the gain of the second stage to change in more precise relatively small (1 dB) increments within each one of the larger sub-ranges set by the first stage. The circuit reduces by five times the number of switches necessary, and reduces digital controlling ports to one-fifth (20%) of the number of the steps. Also, each additional switch produces a three-fold (10 dB) increase in the gain range maintaining the same resolution (1 dB).

In accordance with the invention there is provided a remotely controlled microphone amplifier having a first amplifier stage with a variable gain circuit operatively connected in the overall feedback loop of the first stage for controlling the gain in first increments. A unity gain second amplifier stage has a variable attenuator operatively coupled between the output of the first amplifier stage and the input of the second amplifier stage. The variable attenuator controls the input to the second stage in second increments less than the first increments. The overall gain is linearly adjustable and varies in equal logarithmic increments.

DETAILED DESCRIPTION OF THE INVENTION

Figures 1, 2:
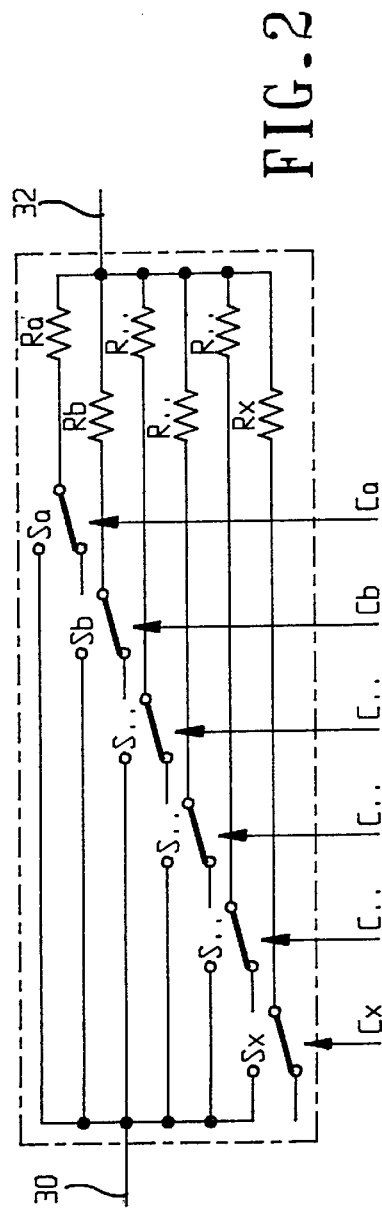
FIG. 1 is a schematic illustration of a microphone amplifier with digitally controlled gain according to the invention.
FIG. 2 is a schematic illustration of an exemplary variable resistance circuit for use in the circuit of FIG. 1.

In accordance with the invention, there is provided a microphone amplifier 10 shown schematically in FIG. 1. The circuit 10 comprises two major sections or stages 12 and 14. The first stage 12 is a high quality, high-gain analog microphone amplifier incorporating low noise transistors Q1 and Q2 and operational amplifiers U1 (non-inverting) and U2 (inverting). The first stage 12 has a balanced differential input 16 which is the balanced input of U1. The two low noise transistors Q1 and Q2 on each of the inverting and non-inverting input of U1 provide preamplification to keep the noise at the lowest possible level and to increase the overall loop gain. Transistors Q1 and Q2 work in a common emitter mode with separate current sources CS1 and CS2 to keep the respective collector currents constant The inverting amplifier U2 in conjunction with non-inverting amplifier U1 furnishes a balanced output signal to the second stage 14, and at the same time provides equivalent driving conditions for both sides of a feedback circuit. In the exemplary embodiment, the feedback circuit comprises resistors R5 and R6 which extend from the output to the input and a parallel combination of a fixed resistor R11 and a remotely controllable variable-resistance cell VRC1 in the input circuit. In accordance with the invention, the variable-resistance cell VRC1 determines the gain Af1 of the first stage as follows:

$$Af1=(1+2Rf1/(VRC1\|R11))=(+2Rf1/(VRC1*R11/(VRC1+R11))),$$

where:

$$R5=R6=Rf1.$$

The gain can be made variable by changing the resistance of VRC1 in the overall feedback circuit of the first stage 12 in an appropriate manner as hereinafter described.

The second stage 14 operates as an active attenuator with a unity gain buffer. The attenauator comprises input resistors R9 and R10 which are bridged by a parallel circuit comprising fixed resistor R12 and remotely controllable variable resistance cell VRC2. The attenuator feeds the non-inverting operational amplifiers U3 and U4 which act as a buffer to the output. The attenuation ratio is:

$$Af2=(1/(2Rf2/(VRC2\|R12)+1))=(1/(2Rf2/((VRC2*R12)/(VRC2+R12))+1))$$

where:

$$R9=R10=Rf2.$$

The attentuation ratio of the second stage 14 may be made variable by changing the resistance of the variable resistance cell VRC2.

The overall transfer ratio (gain and attenuation) of the microphone amplifier 10 with digitally controlled gain in accordance with the present invention is:

$$Af=Af1*Af2$$

$$Af=(1+2Rf1/(VRC1*R11/(VRC1+R11)))*(2Rf2/(VRC2*R12/(VRC2+R12))-1).$$

The VRC circuit shown in FIG. 2 employs parallel connected resistors Ra–Rx in series; with corresponding remotely controllable switches Sa–Sx. Control input lines Ca–Cx provide remote control codes or signals for the respective switches Sa–Sx. Both stages of the MA (10) from FIG. 1 use a variable resistance cells VRC1 and VRC2 with the same overall exemplary configuration. However, the resistor values (Ra–Rx) and control codes (Ca–Cx) are different. By selecting the appropriate resistor values and control codes, VRC1 is capable of providing gains from 0 to 60 dB, controlled in equal increments of 10 dB; and VRC2 produces an attenuation change of 0 dB to 9 dB in 1 db increments. As a result, the invention simultaneously maintains high MA performance and meets all of the previously noted requirements 1~8. Other parameters include:

Balanced input (Input resistance Rin=2.2 k, CMRR=60 dB @ 1 kHz)

Nominal Input level –60 dBu, Nominal output level 0 dBu

Equivalent Input Noise (EIN)=–128.5 dBu

Gain range 0~60 dB (doesn't affect the CMRR)

Number of steps N=60

Maximum output level (headroom)=+22 dBu

Balanced output

Total Harmonic Distortion (THD+N)=0.05%

In FIG. 2, the switches Sa . . . Sx are selectively operable by respective remote control inputs Ca . . . Cx to connect the corresponding parallel connected resistors Ra . . . Rx between the terminals 30–32. Such selective operation provides a circuit having large number of combinations of resistance values which then provide a large number of increments of the gain or attenuation, as the case may be. The switches Sa–Sx may be solid state devices selectively operable by means of a corresponding input signal for each switch.

Figure 3A:
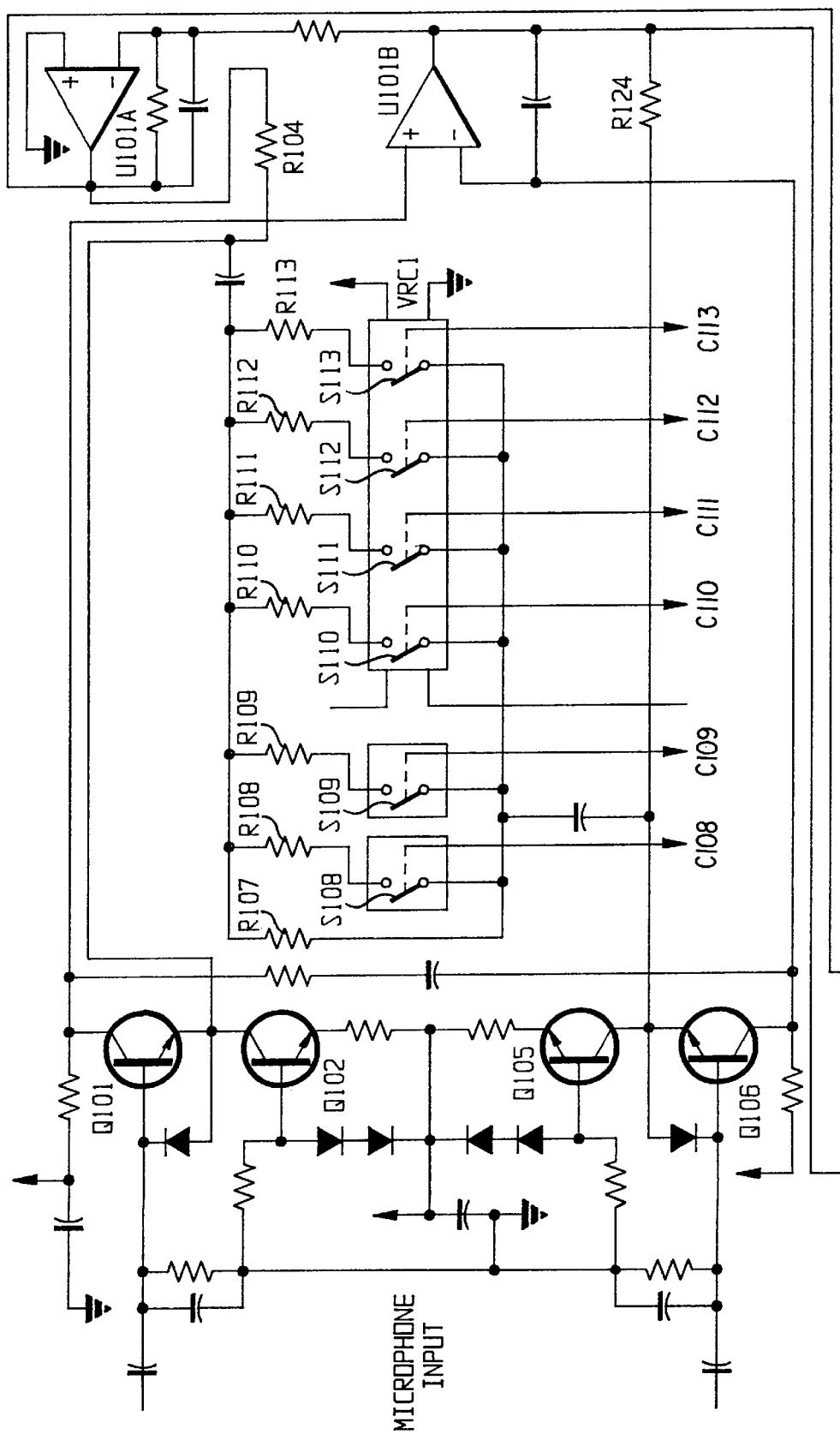
FIGS. 3A & 3B illustrate a more detailed exemplary schematic diagram of the invention.
Figure 3B:
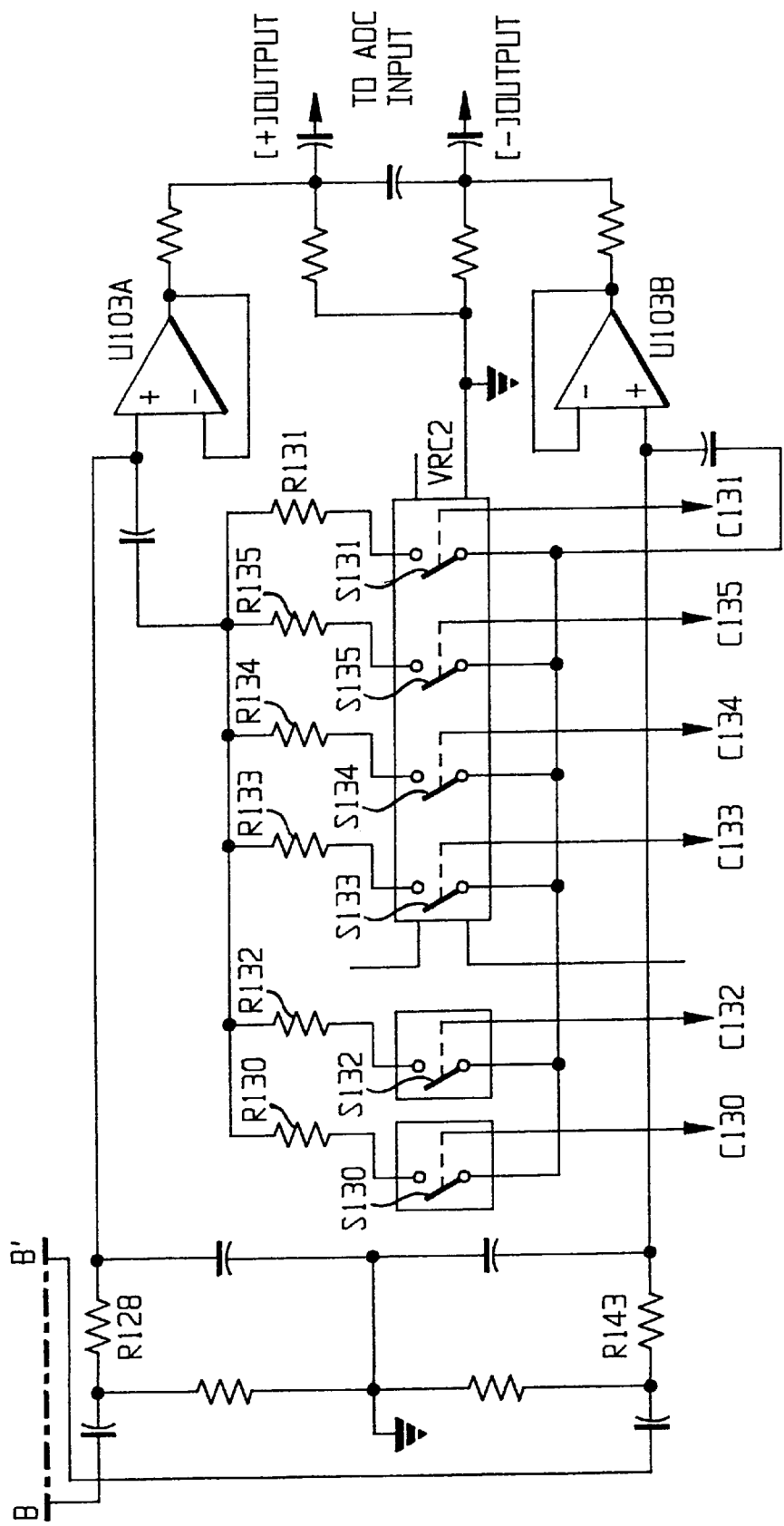

A schematic of an exemplary circuit is shown in FIGS. 3A–3B. The transistors Q101 and Q106 are the two low noise common emitter inputs. Q102 and Q105 are the corresponding constant current sources. Resistor R107 is parallel connected with resistors R108–R113 and corresponding series switches S108–S113 to form variable resistance cell VRC1. Resistors R104 and R124 provide feedback for operational amplifiers U101A and U101B. The resistor R104 is 51 KΩ and resistor R107 is 100 KΩ. Resistors R104 and R107 together with resistors R108–R113, and corresponding switches S108–S113, responsive to respective control input lines C108–C113, produce a combined resistance of about 22 KΩ to about 22Ω resulting in a gain range of 0–60 dB in 10 db increments for the first stage 12.

Resistors R128 and R143 are about 2.7 kΩ and parallel resistors R130–R135 together with corresponding switches S130–S135, likewise responsive to control input lines C130–C135, result in an attenuation of 0–9 dB in 1 dB increments at the input of unity gain operational amplifiers U103A and U103B.

While there have been provided what are considered to be exemplary embodiments of the invention, it will be apparent to those skilled in the art that various changes and modifications therein may be made without departing from the invention, and it is intended in the appended claims to cover such changes and modifications as fall within the true spirit and scope of the invention.

What is claimed:

1. A microphone amplifier comprising:

a first amplifier stage having a variable gain, an input and an output and a feedback circuit;

variable feedback means operatively connected in the feedback circuit of the first amplifier stage for controlling the gain thereof in first selected increments;

a second amplifier stage having a nominal gain and an input and an output;

variable attenuator means operatively coupled between the output of the first amplifier stage and the input of the second amplifier stage, said variable attenuator for controlling the input to said second amplifier stage in second selected increments less than the first increments, said first and second increments being sized such that the amplifier has a resulting overall gain which is substantially linearly adjustable in substantially equal increments.

2. The amplifier of claim 1 wherein the variable feedback means comprises a variable resistance cell.

3. The amplifier of claim 2 wherein the variable resistance cell is remotely controllable.

4. The amplifier of claim 2 wherein the variable resistance cell comprises a plurality of parallel connected resistances and a corresponding series connected remotely controllable switch for each said resistance, said switch being selectively operable for connecting or disconnecting the corresponding resistance in the cell.

5. The amplifier of claim 1 wherein the first amplifier stage comprises balanced operational amplifiers each having an input, and wherein a portion of the feedback means extends between said inputs.

6. The amplifier of claim 1 wherein the variable attenuator includes a variable resistance cell coupled across the input of the second amplifier stage.

7. The amplifier of claim 6 wherein the variable resistance cell is remotely controllable.

8. The amplifier of claim 6 wherein the variable resistance cell comprises a plurality of parallel connected resistances and a corresponding series connected remotely controllable switch for each, said resistance and switch being selectively operable for connecting or disconnecting the corresponding resistance in the cell.

9. The amplifier of claim 1 wherein the second amplifier stage comprises balanced unity gain operational amplifiers.

10. The amplifier of claim 1 wherein the first amplifier stage includes a switch means in the input circuit.

11. The amplifier of claim 10 including a current source in series with the switch means.

12. The amplifier of claim 10 wherein the switch means comprises a common emitter solid state device.

13. The amplifier of claim 1 wherein the first increment is about 10 dB and the second increment is about 1 dB.

14. The amplifier of claim 1 wherein the first amplifier stage and the second amplifier stage each comprises a pair of balanced operational amplifiers.

* * * * *